United States Patent
Vogt

(10) Patent No.: US 10,120,749 B2
(45) Date of Patent: Nov. 6, 2018

(54) EXTENDED APPLICATION OF ERROR CHECKING AND CORRECTION CODE IN MEMORY

(71) Applicant: Intel Corporation, Santa Clara, CA (US)

(72) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 15/282,793

(22) Filed: Sep. 30, 2016

(65) Prior Publication Data

US 2018/0095821 A1     Apr. 5, 2018

(51) Int. Cl.
*G06F 11/00* (2006.01)
*G06F 11/10* (2006.01)
*G11C 11/4093* (2006.01)

(52) U.S. Cl.
CPC ...... *G06F 11/1044* (2013.01); *G11C 11/4093* (2013.01)

(58) Field of Classification Search
CPC ............ G06F 11/1044; G06F 11/1048; G11C 11/4093
See application file for complete search history.

(56) References Cited

U.S. PATENT DOCUMENTS

| | | | |
|---|---|---|---|
| 4,584,681 A | | 4/1986 | Singh et al. |
| 5,454,093 A | * | 9/1995 | Abdulhafiz ......... G06F 12/0859 365/189.05 |
| 6,598,199 B2 | | 7/2003 | Tetrick |
| 6,625,066 B1 | | 9/2003 | Parris et al. |
| 6,633,509 B2 | * | 10/2003 | Scheuerlein ........... G11C 17/16 365/189.04 |
| 6,888,731 B2 | | 5/2005 | Roth et al. |
| 7,051,166 B2 | | 5/2006 | Sharma |
| 7,069,494 B2 | * | 6/2006 | Cargnoni ............ G06F 11/1064 714/763 |
| 7,228,468 B2 | | 6/2007 | Wu et al. |

(Continued)

OTHER PUBLICATIONS

International Search Report and Written Opinion for PCT Patent Application No. PCT/US2017/049318, dated Nov. 30, 2017, 11 pages.

(Continued)

*Primary Examiner* — Joshua P Lottich
(74) *Attorney, Agent, or Firm* — Compass IP Law PC

(57) ABSTRACT

ECC (error checking and correction) can be extended to allow an ECC code to correct memory subarray errors. A memory device includes multiple input/output (I/O) connectors to interface with an external device such as a controller. The memory device includes multiple arrays or subarrays that are specifically mapped to I/O connectors instead of arbitrarily routed. As such, the data paths of the memory subarrays can be exclusively routed to a specific I/O connector. The I/O connector can be uniquely associated with a single memory subarray, or multiple memory subarrays can be mapped to a specific I/O connector. The mapping is in accordance with an error checking and correcting (ECC) code matrix, where a code of the ECC code matrix corresponding to the specific I/O connector is to check and correct data corruption errors and I/O errors for the associated one or multiple memory subarrays.

23 Claims, 9 Drawing Sheets

(56) References Cited

U.S. PATENT DOCUMENTS

| | | | |
|---|---|---|---|
| 7,272,773 B2* | 9/2007 | Cargnoni | G06F 11/1064 |
| | | | 711/E12.017 |
| 7,450,454 B1 | 11/2008 | Bajkowski et al. | |
| 8,358,548 B2 | 1/2013 | Manna et al. | |
| 8,386,887 B2* | 2/2013 | Frost | G06F 11/1008 |
| | | | 714/767 |
| 8,522,072 B2 | 8/2013 | Huang | |
| 8,788,922 B2* | 7/2014 | Anholt | G06F 11/1012 |
| | | | 714/752 |
| 9,195,551 B2 | 11/2015 | Das et al. | |
| 9,817,714 B2* | 11/2017 | Halbert | G06F 11/1068 |
| 9,875,154 B2* | 1/2018 | Miyagi | G06F 11/1068 |
| 9,880,896 B2* | 1/2018 | Coteus | G06F 11/0772 |
| 2004/0210814 A1 | 10/2004 | Cargnoni et al. | |
| 2006/0200729 A1 | 9/2006 | Ito et al. | |
| 2007/0022360 A1 | 1/2007 | Rai et al. | |
| 2007/0263618 A1 | 11/2007 | Omes et al. | |
| 2008/0237848 A1 | 10/2008 | Yoshikawa et al. | |
| 2008/0239808 A1 | 10/2008 | Lin | |
| 2010/0169729 A1 | 7/2010 | Datta et al. | |
| 2010/0169741 A1 | 7/2010 | Laurent et al. | |
| 2012/0306902 A1 | 12/2012 | MacWilliams et al. | |
| 2014/0164869 A1 | 6/2014 | Ordentlich et al. | |
| 2014/0351673 A1 | 11/2014 | Ware et al. | |
| 2015/0113356 A1 | 4/2015 | Ken et al. | |
| 2015/0227461 A1 | 8/2015 | Benedict et al. | |

OTHER PUBLICATIONS

David Locklear, Chipkill Correct Memory Architecture, Dell Enterprise Systems Group, Technology Brief, Aug. 2000, 4 pages.

Doe Hyun Yoon, Mattan Erez, Memory Mapped ECC: Low-Cost Error Protection for Last Level Caches, ACM, 2009, Austin Texas, 12 pages.

IBM Chipkill Memory, Advanced ECC Memory for the IBM Netfinity 7000 M10, Enhancing IBM Nethnity Server Reliability, 6 pages.

Jangwoo Kim, et al., Multi-bit Error Tolerant Caches Using Two-Dimensional Error Coding, Appears in Proceedings of the 40th Annual ACM/IEEE International Symposium on Microarchitecture (MICRO-40), 13 pages.

Tadaaki Yamauchi, et al., The Hierarchical Multi-Bank DRAM: A High-Performance Architecture for Memory Integrated with Processors, ULSI Laboratory, Mitsubishi Electric Corporation, Stanford University, 17 pages.

Timothy J. Dell, A White Paper on the Benefits of Chipkill-Correct ECC for PC Server Main Memory, IBM Microelectronics Division—Rev. Nov. 19, 1997, 24 pages.

Xun Jian, Rakesh Kumar, Adaptive Reliability Chipkill Correct (ARCC), University of Illinois at Urbana Champaign, 12 pages.

* cited by examiner

EXTENDED APPLICATION OF ERROR CHECKING AND CORRECTION CODE IN MEMORY

FIELD

The descriptions are generally related to memory in computing systems, and more particular descriptions are related to error checking and correction in memory.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

As memory devices continue to be scaled to smaller processing geometries and increased densities, the error rate tends to increase. There are multiple mechanisms applied to perform error checking and correction (ECC) to data stored in memory devices, and improve the reliability, accessibility, and serviceability (RAS) of higher density memory devices. One technique involves the striping of data across multiple memory devices, similar to data striping in RAID (redundant array of independent drives) implementations of storage devices. The techniques enable the recovery of data even in the event that an entire memory device fails. The recovery of data in the event that an entire memory device fails can be implemented by Chipkill by IBM (International Business Machines), Extended ECC by Sun Microsystems, DDDC (double device data correction) by Intel Corporation, and others. All trademarks are the property of their respective owners. Features that enable recovery from a full memory device failure are commonly implemented in server devices, where the increased cost of such implementations is seen to justify the improved RAS that such features provide.

It will be understood that implementation of such features typically requires additional hardware. Specifically, more robust ECC implementations include more memory devices to achieve the redundancy of information used to provide the ECC. For a given data access, the system can distribute the data across a large number of devices, and then implement an ECC code that can correct for a complete failure of any one of the devices. It is common to use 18 or 36 separate DRAM (dynamic random access memory) devices to achieve robust ECC implementations. However, the large number of devices traditionally needed for recovery from complete device failure may not be practical for some contexts.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, ECC (error checking and correction) can be extended to allow an ECC code to correct memory subarray errors. A physical routing of the data paths can be mapped in accordance with a mapping of an ECC code to the data bits to be covered by the ECC code. Thus, the ECC code will cover data corruption errors for data stored in a memory subarray, as well as I/O (input/output) path errors. A memory device includes multiple input/output (I/O) connectors to interface with an external device such as a controller. The memory device includes multiple arrays or subarrays that are specifically mapped to I/O connectors instead of arbitrarily routed. The mapping is in accordance with an error checking and correcting (ECC) code matrix, where a code of the ECC code matrix corresponding to the specific I/O connector is to check and correct data corruption errors and I/O errors for the associated one or multiple memory subarrays. As such, the data paths of the memory subarrays can be exclusively routed to a specific I/O connector. The I/O connector can be uniquely associated with a single memory subarray, or multiple memory subarrays can be mapped to a specific I/O connector.

The application of ECC is performed based on what data appears at the I/O connectors. Thus, the mapping of the specific memory resources to the specific I/O pins means that the application of ECC to the data indirectly applies to the specific memory resources the data came from. The ECC applies to the memory resources because the memory resources are mapped to specific I/O connectors. Therefore, the application of ECC is similar to the application of ECC to systems with redundancy based on the memory devices that enables recovery from failure of an entire device. Similar techniques can be applied to recover from a bad subarray of a memory device, which can include internal error of the device, or an error related to the physical interconnection. In one embodiment, the specific mapping can guarantee that the same I/O connector sees all the data bits from a subarray of the memory device when all the bits from a subarray are mapped to the same I/O connector, an ECC code can correct all the bits from the subarray, even if the entire subarray is faulty. For example, consider an access of 288 bits from a memory array, with 16 bits accessed from each subarray mapped to one of 18 I/O connectors (18*16=288). When all 16 bits are mapped to a single I/O connector, the ECC code associated with the I/O connector can correct the failure of all 16 bits from the subarray.

Figure 1:
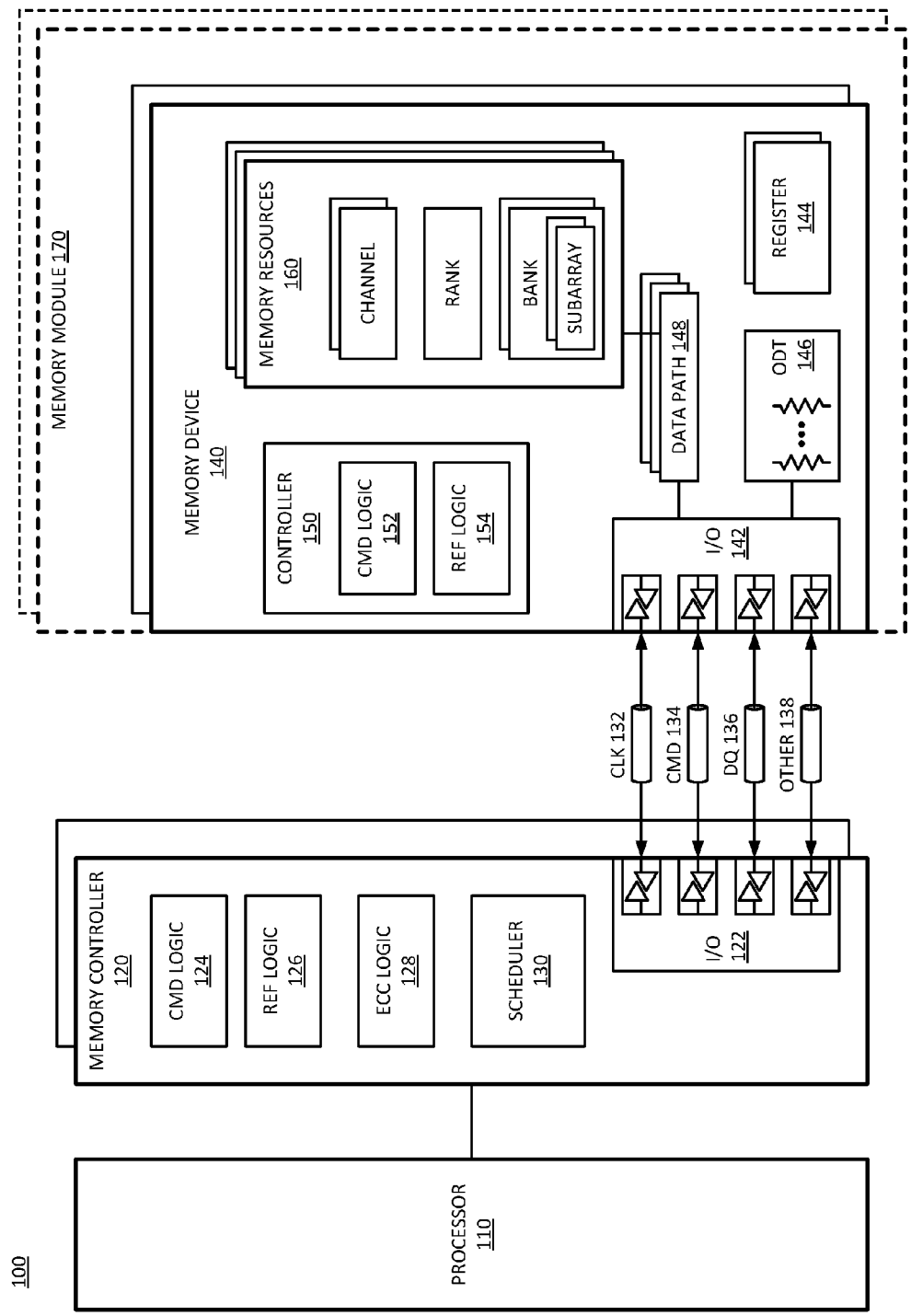
FIG. 1 is a block diagram of an embodiment of a system in which a memory device includes data paths that map memory arrays to specific I/O (input/output) connectors to apply ECC codes to both internal data errors and I/O errors for the data path for that data.

FIG. 1 is a block diagram of an embodiment of a system in which a memory device includes data paths that map memory arrays to specific I/O (input/output) connectors to apply ECC codes to both internal data errors and I/O errors for the data path for that data. System 100 includes a processor and elements of a memory subsystem in a computing device. Processor 110 represents a processing unit of a computing platform that may execute an operating system (OS) and applications, which can collectively be referred to as the host or the user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 100 can be implemented as an SOC (system on a chip), or be implemented with standalone components.

In one embodiment, system 100 represents components of an SOC with in-package memory devices 140. In such an implementation, the components of system 100 will be integrated together on a substrate, and packaged in a common semiconductor packaging.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a x32 interface, a x16 interface, a x8 interface, or other interface. The convention "xW," where W is an integer that refers to an interface size or width of the interface of memory device 140, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a x128 interface, a x256 interface, a x512 interface, a x1024 interface, or other data bus interface width.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., x16 or x8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon VIA (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140, and all memory resources 160 of a single memory device 140 can be part of a single channel, or memory resources 160 can be part of separate channels (with separate I/O 142 for the different channels). Ranks may refer to common locations across multiple memory devices (e.g., same row addresses within different devices). Typically a single memory device belongs to a single rank, and a memory system can include multiple ranks with multiple memory devices each. Banks may refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination) 146, driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. In one embodiment, ODT 146 is applied to DQ signal lines. In one embodiment, ODT 146 is applied to command signal lines. In one embodiment, ODT 146 is applied to address signal lines. In one embodiment, ODT 146 can be applied to any combination of the preceding. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses.

Referring again to memory controller 120, memory controller 120 includes scheduler 130, which represents logic or circuitry to generate and order transactions to send to memory device 140. From one perspective, the primary function of memory controller 120 could be said to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic to allow selection and ordering of transactions to improve performance of system 100. Thus, memory controller 120 can select which of the outstanding transactions should be sent to memory device 140 in which order, which is typically achieved with logic much more complex that a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

In one embodiment, memory devices 140 include in-package DRAM dies, or memory mounted on a common substrate with processor 110 and memory controller 120, which share a semiconductor packaging. In such a configuration, memory devices 140 can function as on-chip cache resources for a 2LM (two level memory) or other multilevel memory system. Memory devices 140 can include HBM memory devices, which can include one or more stacks of memory devices on the substrate shared with processor 110. In one embodiment, memory controller 120 is integrated onto the processor die, and multiple memory dies are mounted on the substrate and interconnect to I/O connectors of the processor die, and thus interconnect to the memory controller device or circuit.

I/O 142 can represent the I/O connectors of memory device 140 to interface with processor 110 and memory controller 120. In one embodiment, memory resources 160 of memory devices 140 include banks divided into subarrays. The subarrays can alternatively be referred to simply as arrays. The subarrays refer to sections of the memory, such as a group of rows of memory cells. Data paths 148 represent the routing of wires and connecting devices to transfer data signals between the subarrays and I/O 142. Instead of being arbitrarily laid out, or laid out in accordance with shortest physical path or other layout, data paths 148 are mapped to specific I/O connectors to provide additional error correction information. In general the specific routing provides that data paths 148 map all data signals from a subarray to a single I/O connector (e.g., one signal line of DQ 136) to enable the application of ECC codes to cover the subarrays as well as the data.

In one embodiment, I/O 142 for each individual memory device 140 includes a data interface having a number of signal lines comparable to an ECC implementation, such as a x18, a x36 interface, a x72 interface, or others. Thus, for example, DQ 136 can include 18, 36, or 72 or other number of signal lines. Such interfaces mimic the bit schemes used for ECC. For example, ECC implementations commonly use 18 or 36 DRAM devices on a memory module. Thus, the same ECC techniques used on system levels based on the numbers of DRAM devices can be applied at the level of the subarrays by having similar bit counts and mapping data paths 148 to ensure that ECC codes of an ECC code matrix that work to correct internal errors can also correct I/O failures for the same bits. It will be understood that DQ 136 routes write data (for a write operation or write transaction) from I/O 142 to the subarrays, and routes read data (for a read operation or read transaction) from the subarrays to I/O 142.

Figure 2:
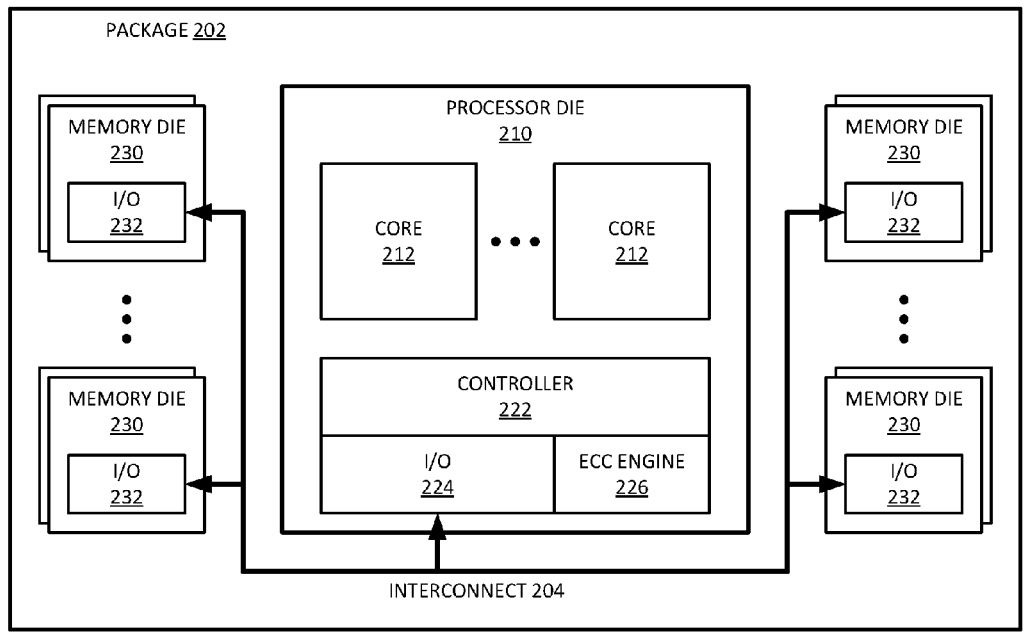
FIG. 2 is a block diagram of an embodiment of a system on a chip with in-package memory that has specific memory array to I/O mappings to enable the use of ECC codes for both data errors and I/O errors.

FIG. 2 is a block diagram of an embodiment of a system on a chip with in-package memory that has specific memory array to I/O mappings to enable the use of ECC codes for both data errors and I/O errors. System 200 provides one example of an SOC, and provides one example of an implementation of system 100. Package 202 represents the SOC packaging, and includes a substrate on which processor die 210 and memory dies 230 are mounted. There is not a specific number of memory dies 230 that are included in package 202. However, by use of data path routing, the number of memory dies 230 can be less than the number that would traditionally be used to implement single device failure protection (e.g., 18 or 36 or other), while still being able to provide an equivalent level of protection.

Processor die 210 includes one or more cores 212, which represent the logic circuits to perform the execution of operations in the processor. In one embodiment, processor die 210 includes controller 222, which can represent a memory controller to access memory dies 230. From the perspective of terminology, it will be understood that a memory controller traditionally interfaces with main system memory, referring to the volatile memory resources that store operating data and code. Traditionally those resources are off-chip and off-package from the processor. With system 200, controller 222 can be referred to as a memory controller from the perspective of access volatile memory dies 230. Controller 222 could alternatively be referred to as a cache controller to access the on-chip or on-package memory resources. In such a case, an additional controller can also be included to access memory resources external to package 202.

Processor die 210 includes I/O 224, which represent I/O hardware to interface on package 202 to memory dies 230. I/O 224 can interface with I/O 232 of memory dies 230 over interconnect 204, which represents multiple signal lines and can represent multiple buses. Interconnect 204 includes at least a data bus. Within each memory die 230, the memory arrays are routed to specific I/O connectors of I/O 232. ECC engine 226 of processor die 210 represents logic to perform ECC on the data exchanged (e.g., read or write) with memory dies 230. ECC engine 226 includes ECC logic, such as known ECC algorithms, to compute ECC calculations to check and possibly correct errors in data. As such, controller 222 and memory dies 230 will exchange data and check bits. For Write, ECC engine 226 computes the ECC check bits and sends the bits with the write data. For Read, memory dies 230 retrieve or fetch data and stored check bits and send them to controller 222. Controller 222 can then compute the ECC for the received data based on the check bits. In one embodiment, memory dies 230 also include internal ECC. Thus, system 200 can include internal ECC on individual memory devices, and well as system-wide ECC executed by controller 222 or the processor, which can perform computations on data received from multiple memory dies 230 to perform ECC calculations.

In one embodiment, system 200 can provide a client or a server product with DRAM devices in package with a CPU. In one embodiment, memory dies 230 provide HPC (high performance computing) main memory. In one embodiment, memory dies 230 provide graphics memory. In one embodiment, memory dies 230 provide first level memory of a multilevel memory (MLM) system. In one embodiment, memory dies 230 provide memory for check pointing. In one embodiment, memory dies 230 provide a combination of these. Thus, improved error coverage can be provided to any or all of these contexts.

In accordance with what is described herein, memory dies 230 include circuit mappings that transfer bits consistently between specific areas of memory to the same I/O pins or connectors. Applying a knowledge of an ECC coding implementation to the data path circuit layout, system 200 includes an additional level of correction over what can traditionally be provided. Thus, in one embodiment, in-package-memory devices can map a subset of the memory array and data paths to a common I/O pin. Such an approach is contrasted with traditional mappings, which can result in the data from an individual subarray being spread across multiple I/O pins.

Figure 3:
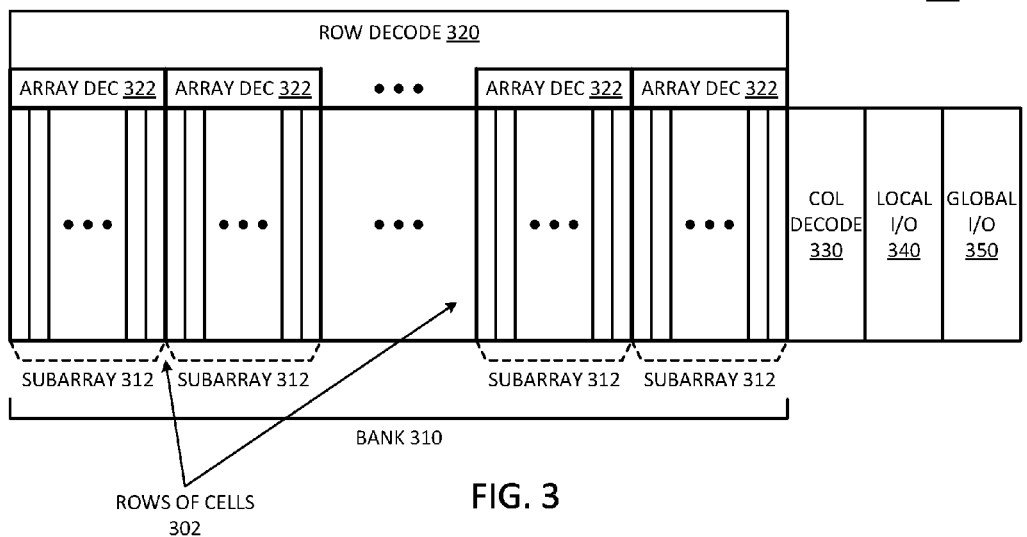
FIG. 3 is a block diagram of an embodiment of memory elements of a memory device that are mapped to specific I/O connectors.

FIG. 3 is a block diagram of an embodiment of memory elements of a memory device that are mapped to specific I/O connectors. Memory 300 illustrates components of a memory device with a specific mapping of I/O to portions of the memory array, in accordance with any embodiment described herein. For example, memory 300 can represent an embodiment of memory die 230 of system 200 or memory device 140 of system 100.

Memory 300 includes bank 310, which includes multiple rows of memory cells 302. The vertical rectangles of the diagram represent the rows. In one embodiment, bank 310 is organized as multiple subarrays 312. Subarray 312 or an array can refer to a group of rows 302. An access command (either a Read command or a Write command) triggers command signal lines that are interpreted by row decode logic 320 to select a row or rows for the operation. In one embodiment, row decode logic 320 includes subarray or array decode logic 322 to select a specific subarray 312 of bank 310. Memory 300 includes column decode logic 330 to select a column of data, where signal lines from specific subarrays can be output to sense amplifiers and routed with local I/O 340 to global I/O 350. Local I/O 340 refers to the routing circuitry to transfer data of specific subarrays 312. Global I/O 350 refers to the routing circuitry that couples the local I/O to the external I/O connectors of memory 300. In one embodiment, local I/O 340 includes logic to map specific signal lines from subarrays 312 to specific I/O paths or data paths that connect to specific global I/O connectors.

In memory 300, the data paths from subarrays 312 to local I/O 340 or global I/O 350 or both are organized to maximize the number of faults that an ECC code will be able to detect and correct. Assuming that mechanical I/O pin failures are a common failure mechanism for in-package memory, it will be understood that mapping the data paths from subarrays to external I/O connectors in accordance with an application of ECC codes for the data can enable I/O failure to be corrected by the ECC code. It will further be understood that some failures in the memory device are limited to a subset of the total memory array. If the subsets of memory arrays and the data paths to and from these subsets are mapped to a single I/O connector, the ECC code will also be able to correct failures of these memory subsets and data paths. The data path refers to the wires, traces, logic gates, and other circuitry to transfer data between the subarrays and the I/O.

Figure 4:
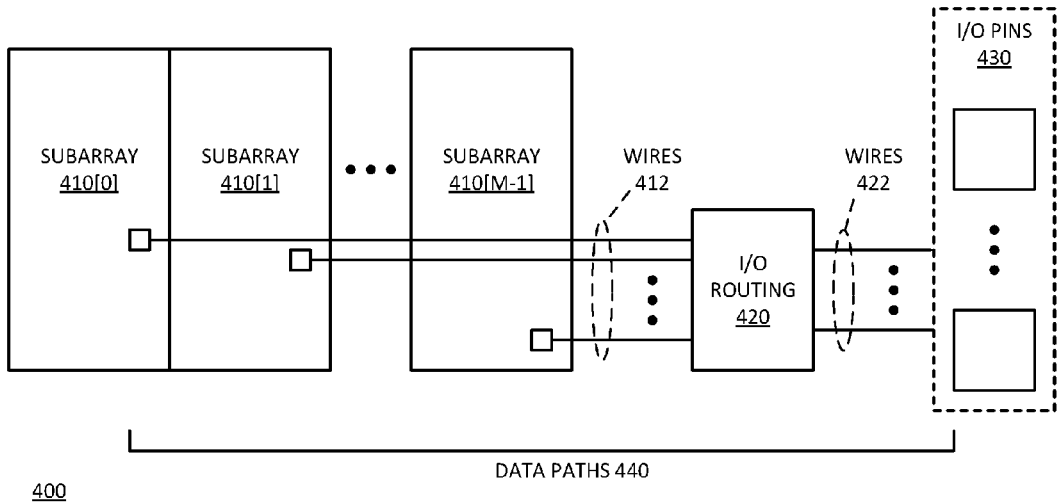
FIG. 4 is a block diagram of an embodiment of a mapping of subarrays to I/O pins with I/O routing that ensures data from a subarray exclusively maps to a specific I/O pin.

FIG. 4 is a block diagram of an embodiment of a mapping of subarrays to I/O pins with I/O routing that ensures data from a subarray exclusively maps to a specific I/O pin. Memory 400 provides one example of a memory device in accordance with memory 300 of FIG. 3. As illustrated, memory 400 includes M subarrays 410[0:(M−1)]. In one embodiment, the number of subarrays is a multiple of the number of signal lines of the data bus. For example, a x18 memory die may include 18, 36, 54, or other number of subarrays 410.

Wires 412 represent connections from the subarrays to I/O routing logic 420. I/O routing logic 420 can include multiplexers, drivers, buffers, or other components, or a combination. Wires 422 represent the connections from routing logic 420 to I/O pins 430. I/O pins 430 represent the I/O connectors of memory 400 to exchange data with a controller. ECC is performed on the data by the controller as it appears on I/O pins 430. In one embodiment, data paths 440 refer to the electrical path for data signal transfer between subarrays 410 and I/O pins 430.

It will be understood that there will be at least M wires 412 to carry signals between the subarrays and I/O routing logic 420. Typically there will be fewer wires 422 to carry signals between I/O routing logic 420 and I/O pins 430. In one embodiment, data is transferred over multiple transfer cycles (e.g., a burst), such as clock periods or UIs. Thus, multiple signals can be time multiplexed on wires 422. Data paths 440 include specific routing to ensure that a subarray 410 is mapped to a single I/O pin 430. There may be multiple subarrays 410 mapped to the same I/O pin, but a specific subarray 410 may be mapped to only a specific I/O pin. If there are multiple wires 412 from a subarray 410 to I/O routing logic 420, all pins will be mapped to the same I/O pin, and multiplexed over time on wires 422.

Figure 5A:
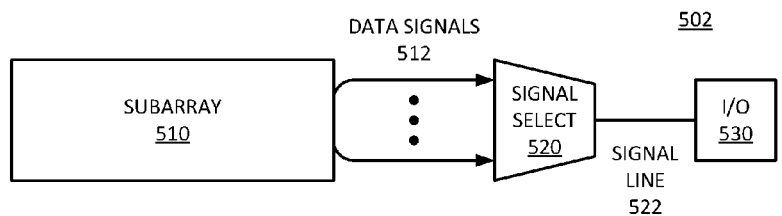
FIG. 5A is a block diagram of an embodiment of I/O routing to map multiple data bits of a subarray to a single I/O connector.

FIG. 5A is a block diagram of an embodiment of I/O routing to map multiple data bits of a subarray to a single I/O connector. Circuit 502 illustrates one example of a data path in accordance with data paths 440 of FIG. 4. Subarray 510 represents a subset of rows of a bank of a memory device. In one embodiment, multiple data signals 512 convey data to and from subarray 510. The data path between subarray 510 and I/O pin 530 can include one or more signal lines to carry data signals 512, signal select logic 520 (such as a multiplexer/demultiplexer circuit), and signal line 522. In one embodiment, multiple signal lines carry data signals 512 between subarray 510 and signal select 520. In one embodiment, multiple data signals are sent over time and buffered via signal select 520. There will typically be one signal line 522 between signal select 520 and I/O pin 530. Thus, the data path maps subarray 510 to the specific I/O pin 530.

Figure 5B:
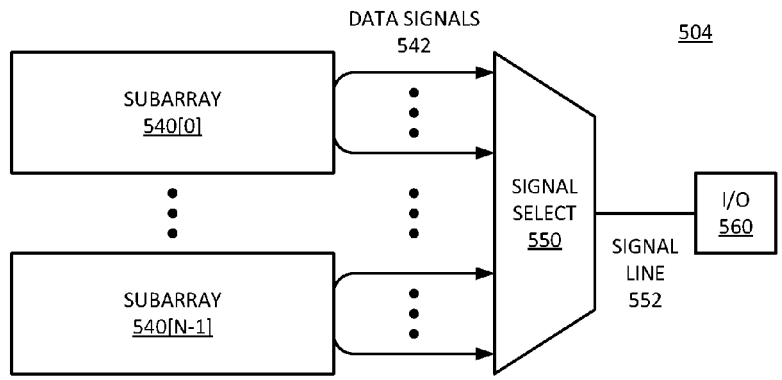
FIG. 5B is a block diagram of an embodiment of I/O routing to map multiple data bits of multiple subarrays to a single I/O connector.

FIG. 5B is a block diagram of an embodiment of I/O routing to map multiple data bits of multiple subarrays to a single I/O connector. Circuit 504 illustrates one example of a data path in accordance with data paths 440 of FIG. 4. Circuit 504 can be an alternative to circuit 502 of FIG. 5A. Subarrays 540[0:(N−1)] represent multiple subsets of rows of a bank of a memory device. In one embodiment, multiple data signals 542 convey data to and from each subarray 540, where "subarray 540" refers collectively to the N arrays. The data path between each subarray 540 and I/O pin 560 can include one or more signal lines to carry data signals 542, signal select logic 550 (such as a multiplexer/demultiplexer circuit), and signal line 552. In one embodiment, multiple signal lines carry data signals 542 between each subarray 540 and signal select 550. In one embodiment, multiple data signals are sent over time and buffered via signal select 550. There will typically be one signal line 552 between signal select 550 and I/O pin 560. Thus, the data path maps multiple subarrays 540 to the specific I/O pin 560.

As illustrates, in one embodiment, a data path exclusively maps a memory subarray to a specific I/O connector. In one embodiment, one I/O connector is mapped to a single memory subarray. In one embodiment, multiple memory subarrays are mapped to a common I/O connector. Thus, each memory subarray is mapped to a single I/O connector, but the I/O connector may map to multiple memory subarrays. Therefore, the data path can provide a 1:1 relationship between memory subarray and I/O connector, or an M:1 relationship between memory subarray and connector.

Figure 6:
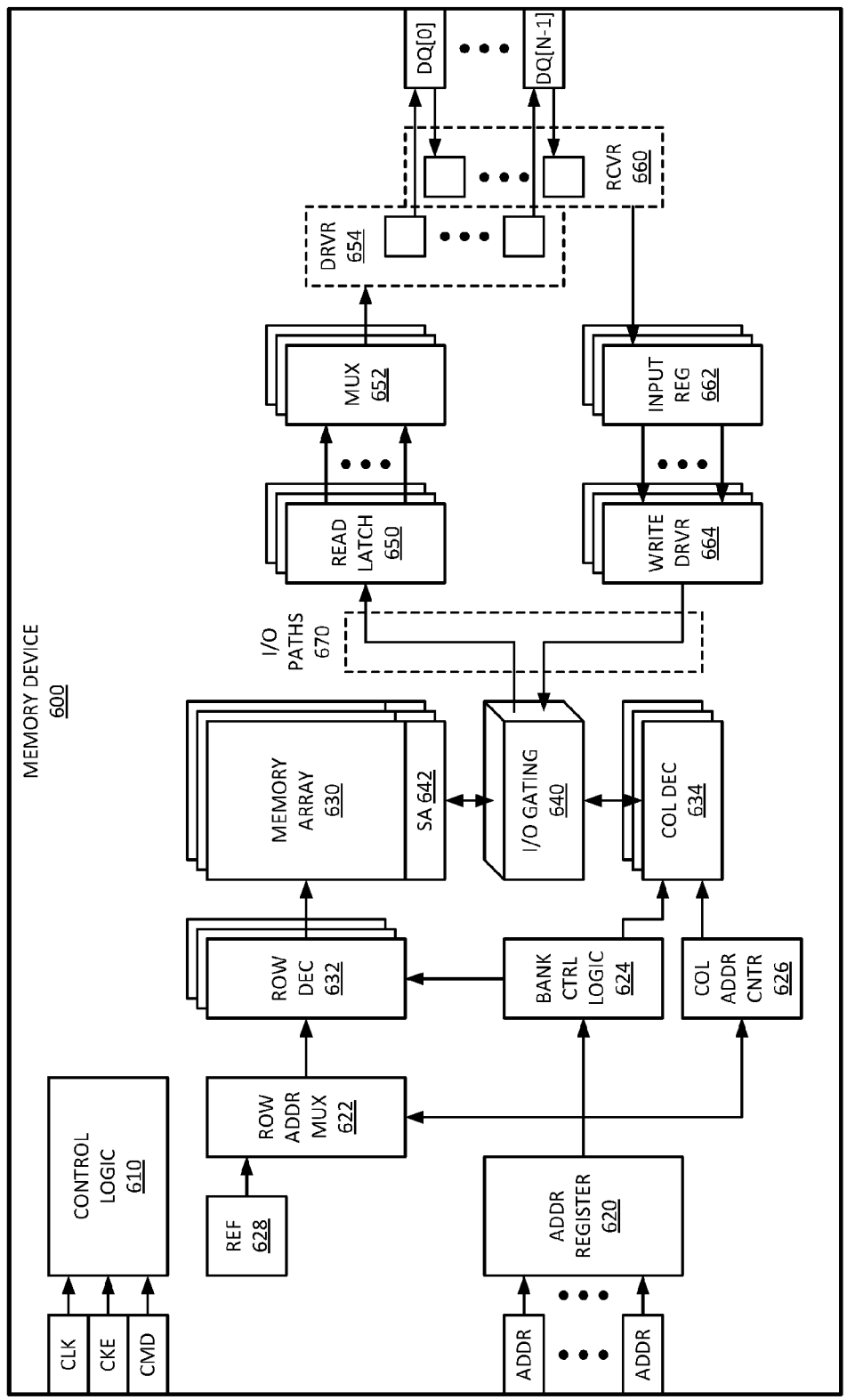
FIG. 6 is a block diagram of an embodiment of a memory device with I/O routing to enable ECC codes to cover both data errors and I/O errors.

FIG. 6 is a block diagram of an embodiment of a memory device with I/O routing to enable ECC codes to cover both data errors and I/O errors. Memory device 600 represents one example of a memory device in accordance with memory devices 140 of system 100, memory die 230 of system 200, or memory device 300. In one embodiment, memory device 600 is a DRAM device mounted to a substrate to connect to a CPU as in-package memory.

Control logic 610 receives clock (CLK), clock enable (CKE), and command signals (CMD), and controls the operation of memory device 600 in relation to those signals. Address register 620 receives row address and bank address signals to identify the portion of memory that is to be affected by a particular command. The address, clock, clock enable, and command signals represent I/O connectors for command and address for memory device 600. In one embodiment, address register 620 distributes the address information to row address multiplexer 622, bank control logic 624, and column address counter 626. Row address mux 622 takes the row address information and a refresh counter (REF 628) as input, and controls the row address latch (RAL) and decoder (row decoder 632) for each bank of the memory device. Bank control logic 624 selects which bank will be selected for the memory access operation (e.g., based on the command) received. Column address counter 626 generates a signal to select the column for the operation.

Row decoder 632 selects an address in a bank, which can include a row of memory array 630. In one embodiment, memory arrays 630 can be or include subarrays. Signals from bank control logic 624 and column address counter 626 can trigger column decoder (col dec) 634 to activate the appropriate sense amplifiers (SA) 642 for the desired memory array 630. Column decoder 634 can trigger I/O gating 640, which represent the hardware including signal lines or wires as well as logic to route data to and from memory arrays 630. I/O gating 640 can place data into sense amplifiers 642 for a write operation, and can read the data out for a read operation. Column decoder 634 makes a column selection for I/O gating 640 based on bank control logic selection and the column address counter selection and.

In one embodiment, read latch 650 is coupled to receive data bits from I/O gating 640 for a read operation. Read latch 650 feeds the data into mux 652, which can select the number of bits corresponding to the device data interface (the N DQ bits illustrated in memory device 600. Mux 652 can send the data to driver 654, which will drive the data on I/O connectors DQ[0:(N−1)]. While not specifically illustrated, it will be understood that driver 654 can drive on or more data strobe lines based on the timing. For a write operation, the controller will provide data on DQ[0:(N−1)]. In one embodiment, receiver 660 receives write data from the data bus, and inputs it into input register or input buffer 662. In one embodiment, receiver 660 receives a data mask signal (DM) that can indicate when the memory device should perform a read operation. Input register 662 samples the data in accordance with a data strobe line, and can latch the data to write driver 664, which provides the data to I/O gating 640.

In one embodiment, memory device 600 includes I/O paths 670 to transfer data between I/O gating 640 and the read and write paths. Thus, in one embodiment a data path includes a read path and a write path. I/O paths 670 can be specifically routed to map one or more memory arrays 630 to specific I/O connectors, referring to DQ[0:(N−1)]. The specific mapping enables the extension of ECC to cover the data paths as well as the data.

Figure 7:
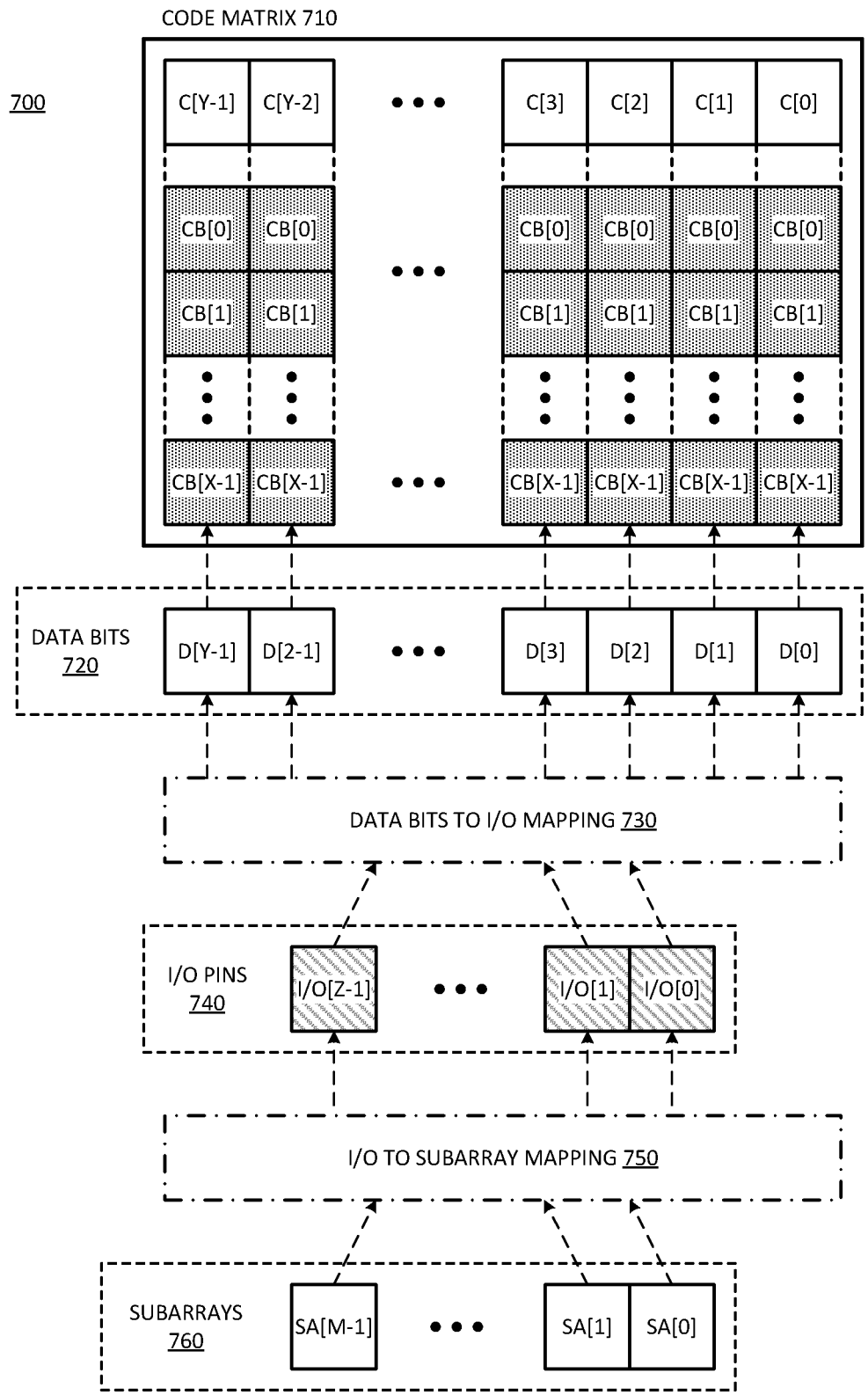
FIG. 7 is a block diagram of an embodiment of data path mapping to be able to apply ECC codes to check and correct I/O errors.

FIG. 7 is a block diagram of an embodiment of data path mapping to be able to apply ECC codes to check and correct I/O errors. Diagram 700 provides an illustration of the mapping of data I/O to memory subarrays. More specifically, matrix 710 represents an ECC code matrix. Matrix 710 includes Y columns (C[0:(Y−1)]) of codes, each code including X code bits or check bits (CB[0:(X−1)]). In one embodiment, the Y codes of matrix 710 correspond to data bits 720, which are D[0:(Y−1)]. The computation of the codes from the code word (e.g., selected ones of the data bits) can allow the checking and correcting of errors. A non-zero syndrome in any of the codes (e.g., an XOR of the codes of the matrix with corresponding calculations from the data bits and ECC bits) can indicate an error.

In one embodiment, data bits 720 are mapped to the I/O pins with mapping 730. Such a mapping can be based on a standardized output, or a configured implementation for a specific device, where certain pins are designated and interpreted as specific I/O. The mapping 730 can map data bits 720 to I/O pins 740. With the mapping of specific I/O pins 740, there is a correlation between the ECC codes of matrix 710 and the I/O pins. As illustrated, system 700 includes Z I/O pins 740 (i.e., I/O[0:(Z−1)]). In a typical system, data is burst over multiple cycles, and thus there are a total number of I/O pins in the system (where the total number includes the pins on all memory devices) that is typically related by Z=Y/BL, where BL is the burst length or the number of cycles of data sent in the system. For an individual memory device, the number of I/O pins per device would typically be Z/(# devices) or the total number of pins divided by the number of devices. Regardless of the specific implementation, there is a correlation between I/O pins of a specific memory device and codes of matrix 710. Such a correlation may be implemented in many ECC contexts.

As described herein, system 700 includes I/O to subarray mapping 750. Mapping 750 represents a mapping for each individual memory device in which its memory array resources represented by subarrays 760 are mapped to specific I/O pins 740 for the individual memory device, which can be the only I/O pins in system 700 or part of the overall I/O pins for data in system 700. M subarrays 760 are illustrated, where M can vary based on the implementation of the memory device. In one embodiment, M is related to the number of I/O pins for a single memory device, for example, where M could be a multiple of Z/(# devices). Mapping 750 enables the routing of subarrays 760 to I/O pins 740 to be in accordance with the ECC patterns for system 700. In one embodiment, the mapping of subarrays to I/O pins and ECC codes enables a code of matrix 710 to correspond to a specific I/O pin 740, which can check and correct data corruption errors and I/O errors for the associated subarray 760. Mapping 750 enables the exclusive mapping of a subarray 760 to a single I/O pin. Mapping 750 enables the mapping of multiple subarrays exclusively to a single I/O pin.

Figure 8:
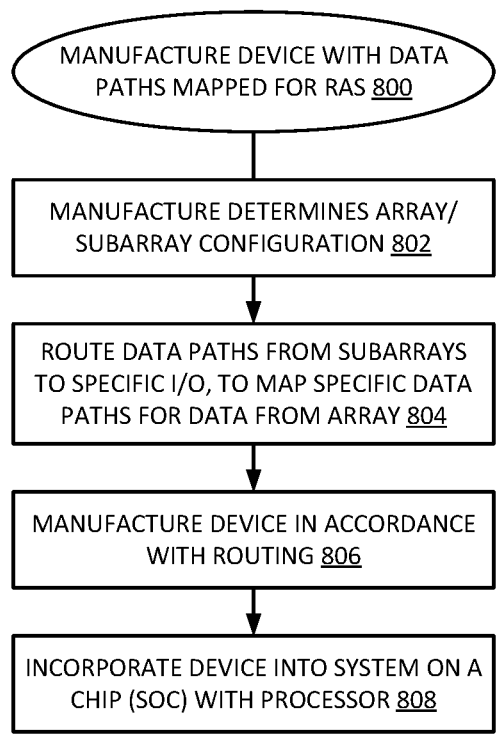
FIG. 8 is a flow diagram of an embodiment of a process for manufacturing a memory device with data paths mapped to specific I/O.

FIG. 8 is a flow diagram of an embodiment of a process for manufacturing a memory device with data paths mapped to specific I/O. Flow 800 represents a flow for manufacturing a device with data paths mapped to specific I/O for RAS. To manufacture the memory device, a manufacturer determines an array/subarray configuration, 802. The array configuration refers to the architecture of the memory resources.

Thus, the memory cells are organized in rows and banks, with the banks organized as subarrays or sub-banks.

In one embodiment, the manufacturer routes data paths of the memory array structure to specific I/O for the memory device, to having specific memory subarrays mapped to specific I/O, 804. It will be understood that a manufacturer does not need to identify a specific ECC code to be used for an ECC implementation. Simply by mapping the subarrays to specific I/O can enable the application of ECC to the subarrays by virtue of all data from the subarrays being mapped to a specific I/O connector, which will in turn by associated with a specific ECC code in the matrix. Thus, the signal lines and circuit logic that interconnects a subarray to an I/O connector can route all data between the subarray and the I/O connector to ensure that ECC for the I/O connector also applies to the data paths.

The manufacturer manufactures the device in accordance with the routing, including creating circuitry to route the data signals, 806. In one embodiment, the memory device is incorporated into an SOC with a processor, 810. The incorporation of the memory die onto an SOC platform can be performed by the same manufacturer, or a different manufacturer. Typically today the incorporation into an SOC will occur by a different entity than the one that manufactures the memory chips.

Figure 9:
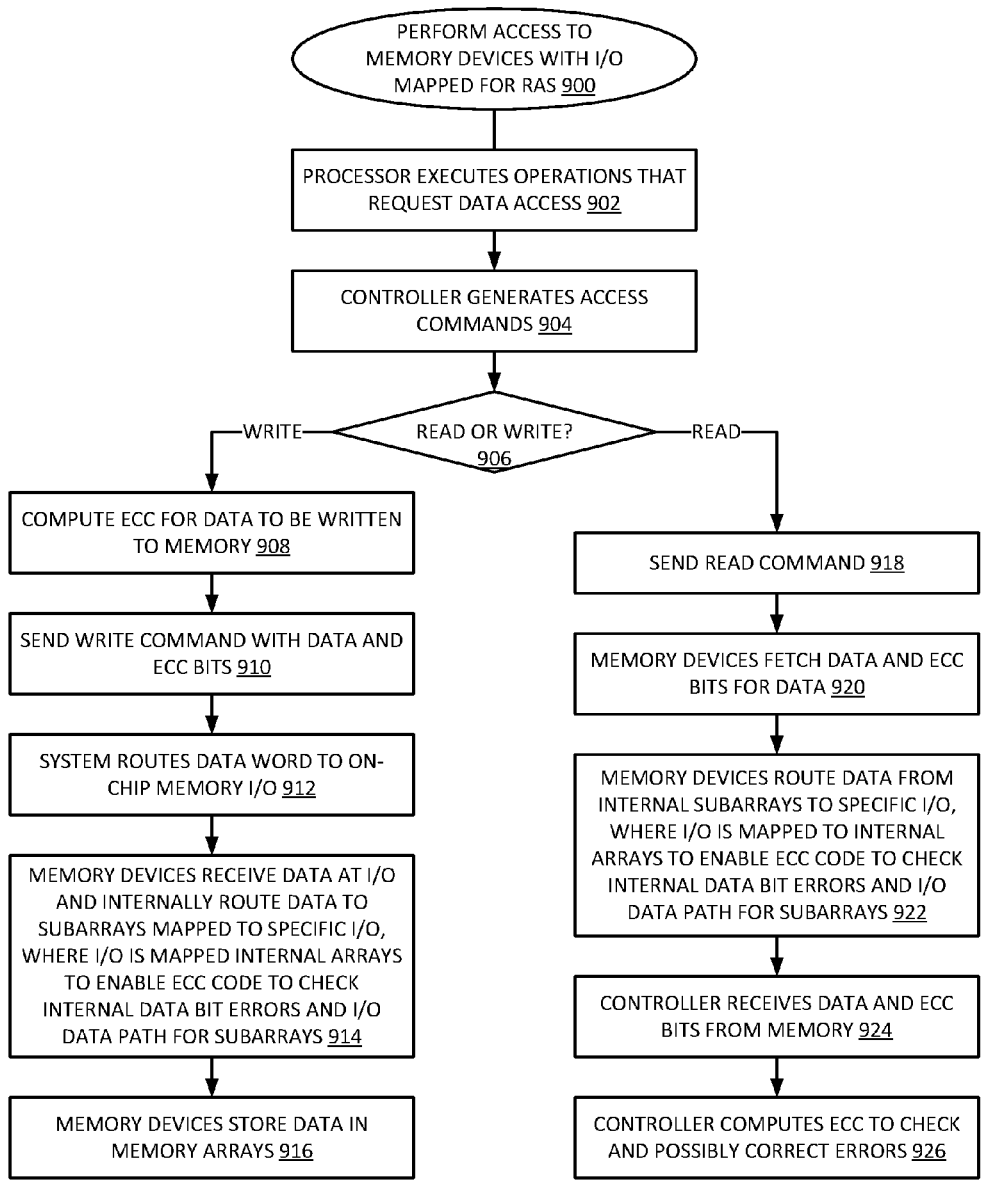
FIG. 9 is a flow diagram of an embodiment of a process for data access to a memory device with data paths mapped to specific I/O.

FIG. 9 is a flow diagram of an embodiment of a process for data access to a memory device with data paths mapped to specific I/O. Process 900 illustrates one embodiment of performing access to memory devices that have I/O mapped to specific I/O connectors. The processor of a system incorporating the memory executes operations that results in requests for data access from the memory devices, 902. In one embodiment, the memory controller that controls access to the memory devices generates the access commands to read or write the data in accordance with the operations executed by the processor, 904.

In the case of a write operation, 906 WRITE branch, the memory controller can compute ECC for the data to be written to memory, 908. The controller then sends the write command with the data and the ECC bits, 910. In one embodiment, the system includes memory as on-package or on-chip memory. Thus, the controller can route the data word to on-chip memory I/O, 912. In one embodiment, the on-chip memory devices receive the data at the I/O, and internally route the data to subarrays mapped to specific I/O connectors, 914. The I/O is mapped in accordance with any embodiment described herein, where I/O is mapped to the internal array to enable the ECC code for the data to check internal data bit errors, as well as check the I/O data path for the subarrays due to the specific mapping. The memory devices store the data in their internal memory subarrays in accordance with the data path mapping, 916.

In the case of a read operation, 906 READ branch, the memory controller can send the read command to the memory, 918. In response to the read command, the memory devices fetch the data and associated ECC bits for the data, 920. In one embodiment, the memory devices route the data from their internal subarrays to specific I/O connectors, 922. The I/O is mapped in accordance with any embodiment described herein, where I/O is mapped to the internal array to enable the ECC code for the data to check internal data bit errors, as well as check the I/O data path for the subarrays due to the specific mapping. The memory devices send the data to the controller, which can receive the data and ECC bits, 924. In one embodiment, the controller computes ECC to check and possibly correct errors, which will apply to both the data and the I/O path, 926.

Figure 10:
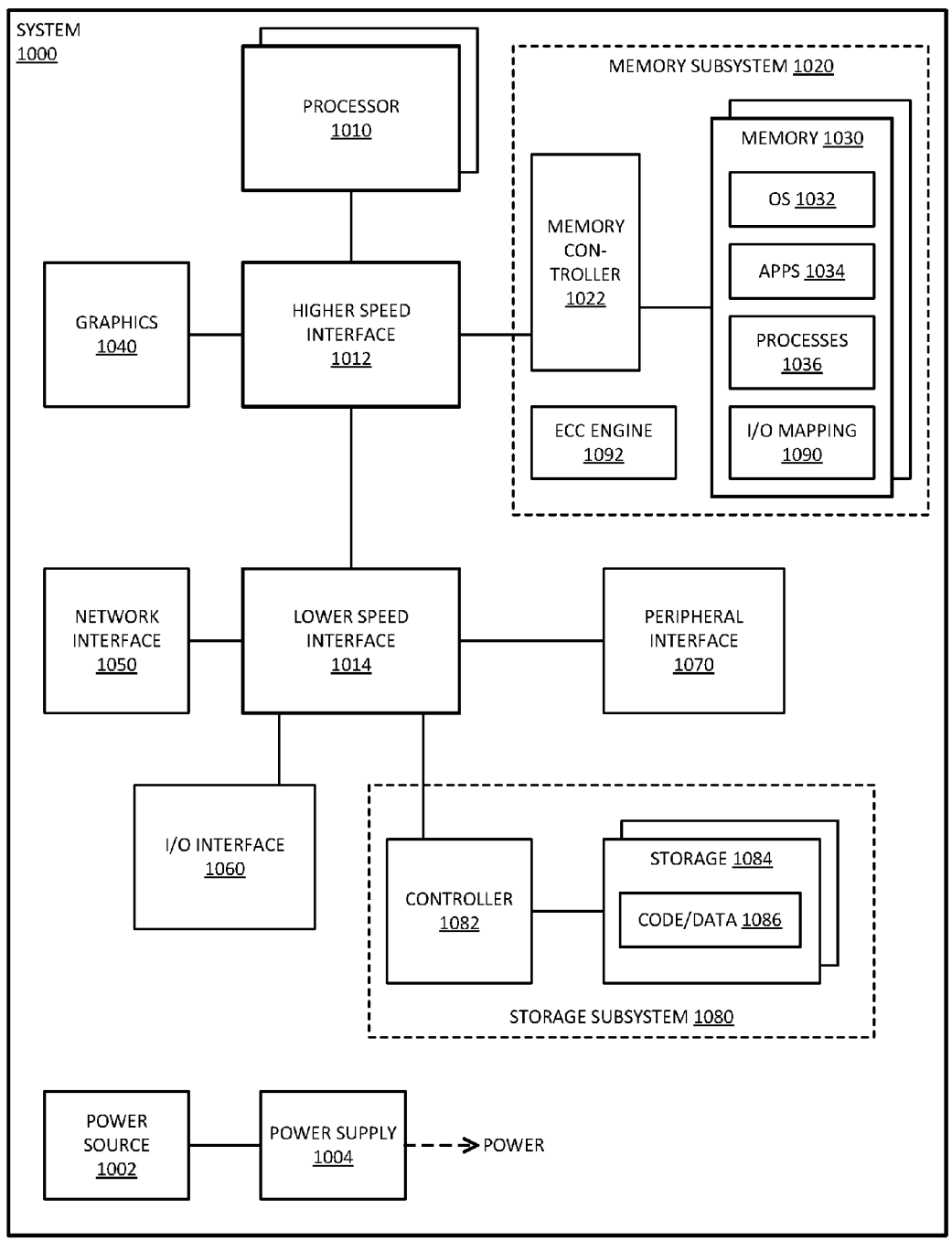
FIG. 10 is a block diagram of an embodiment of a computing system in which a memory device with a mapping of arrays to I/O for application of ECC can be implemented.

FIG. 10 is a block diagram of an embodiment of a computing system in which a memory device with a mapping of arrays to I/O for application of ECC can be implemented. System 1000 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1000 includes interface 1012 coupled to processor 1010, which can represent a higher speed interface or a high throughput interface for system components that needs higher bandwidth connections, such as memory subsystem 1020 or graphics interface components 1040. Interface 1012 can represent a "north bridge" circuit, which can be a standalone component or integrated onto a processor die. Where present, graphics interface 1040 interfaces to graphics components for providing a visual display to a user of system 1000. In one embodiment, graphics interface 1040 generates a display based on data stored in memory 1030 or based on operations executed by processor 1010 or both.

Memory subsystem 1020 represents the main memory of system 1000, and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one embodiment, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1000 includes interface 1014, which can be coupled to interface 1012. Interface 1014 can be a lower speed interface than interface 1012. In one embodiment, interface 1014 can be a "south bridge" circuit, which can include standalone components and integrated circuitry. In one embodiment, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can exchange data with a remote device, which can include sending data stored in memory or receiving data to be stored in memory.

In one embodiment, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one embodiment, system 1000 includes storage subsystem 1080 to store data in a nonvolatile manner. In one embodiment, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one embodiment, storage subsystem 1080 includes controller 1082 to interface with storage 1084. In one embodiment controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1002 to provide power to the components of system 1000. In one embodiment, power supply 1004 includes an AC to DC (alternating current to direct current) adapter to plug into a wall outlet. Such AC power can be renewable energy (e.g., solar power) power source 1002. In one embodiment, power source 1002 includes a DC power source, such as an external AC to DC converter. In one embodiment, power source 1002 or power supply 1004 includes wireless charging hardware to charge via proximity to a charging field. In one embodiment, power source 1002 can include an internal battery or fuel cell source.

In one embodiment, memory subsystem 1020 of system 1000 includes ECC engine 1092, which represents logic to perform ECC on data stored in memory 1030. In one embodiment, memory 1030 includes I/O mapping 1090, which represents a mapping of arrays of memory to specific I/O connectors in accordance with any embodiment described herein. The I/O is mapped in accordance with any embodiment described herein, where I/O is mapped to internal subarrays to enable the ECC code for the data to check internal data bit errors, as well as check the I/O data path for the subarrays due to the specific mapping. Thus, when ECC engine 1092 performs ECC computations, the ECC covers both the data and the I/O paths due to the specific mapping of the I/O data paths.

Figure 11:
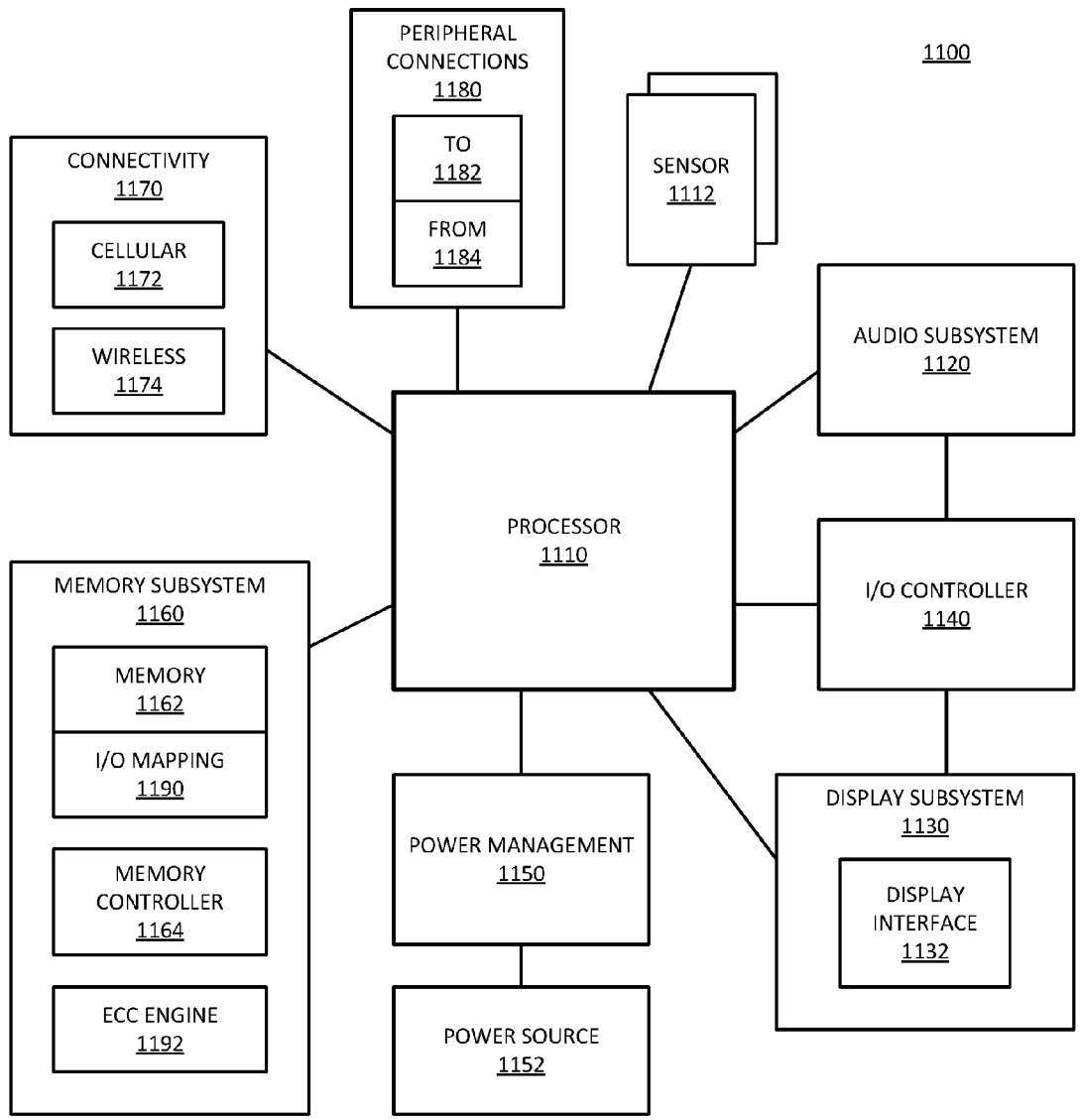
FIG. 11 is a block diagram of an embodiment of a mobile device in which a memory device with a mapping of arrays to I/O for application of ECC can be implemented.

FIG. 11 is a block diagram of an embodiment of a mobile device in which a memory device with a mapping of arrays to I/O for application of ECC can be implemented. Device 1100 represents a mobile computing device, such as a computing tablet, a mobile phone or smartphone, a wireless-enabled e-reader, wearable computing device, an internet-of-things device, or other mobile device, or an embedded computing device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and device functions are executed. The processing operations include operations related to I/O (input/output) with a human user or with other devices, operations related to power management, operations related to connecting device 1100 to another device, or a combination. The processing operations can also include operations related to audio I/O, display I/O, or other interfacing, or a combination. Processor 1110 can execute data stored in memory. Processor 1110 can write or edit data stored in memory.

In one embodiment, system 1100 includes one or more sensors 1112. Sensors 1112 represent embedded sensors or interfaces to external sensors, or a combination. Sensors 1112 enable system 1100 to monitor or detect one or more conditions of an environment or a device in which system 1100 is implemented. Sensors 1112 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1112 can also include sensors for biometric systems such as fingerprint recognition systems, face detection or recognition systems, or other systems that detect or recognize user features. Sensors 1112 should be understood broadly, and not limiting on the many different types of sensors that could be implemented with system 1100. In one embodiment, one or more sensors 1112 couples to processor 1110 via a frontend circuit integrated with processor 1110. In one embodiment, one or more sensors 1112 couples to processor 1110 via another component of system 1100.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software components (e.g., drivers) that provide a visual display for presentation to a user. In one embodiment, the display includes tactile components or touchscreen elements for a user to interact with the computing device. Display subsystem 1130 includes display interface 1132, which includes the particular screen or hardware device used to provide a display to a user. In one embodiment, display interface 1132 includes logic separate from processor 1110 (such as a graphics processor) to perform at least some processing related to the display. In one embodiment, display subsystem 1130 includes a touchscreen device that provides both output and input to a user. In one embodiment, display subsystem 1130 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 1130 generates display information based on data stored in memory and operations executed by processor 1110.

I/O controller 1140 represents hardware devices and software components related to interaction with a user. I/O controller 1140 can operate to manage hardware that is part of audio subsystem 1120, or display subsystem 1130, or both. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 or display subsystem 1130 or both. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100, or sensors 1112. The input can be part of direct user interaction, as well as providing environmental input to the system to influence its operations (such as filtering for noise, adjusting displays for brightness detection, applying a flash for a camera, or other features).

In one embodiment, device 1100 includes power management 1150 that manages battery power usage, charging of the battery, and features related to power saving operation. Power management 1150 manages power from power source 1152, which provides power to the components of system 1100. In one embodiment, power source 1152 includes an AC to DC (alternating current to direct current) adapter to plug into a wall outlet. Such AC power can be renewable energy (e.g., solar power, motion based power). In one embodiment, power source 1152 includes only DC power, which can be provided by a DC power source, such as an external AC to DC converter. In one embodiment, power source 1152 includes wireless charging hardware to charge via proximity to a charging field. In one embodiment, power source 1152 can include an internal battery or fuel cell source.

Memory subsystem 1160 includes memory device(s) 1162 for storing information in device 1100. Memory subsystem 1160 can include nonvolatile (state does not change if power to the memory device is interrupted) or volatile (state is indeterminate if power to the memory device is interrupted) memory devices, or a combination. Memory 1160 can store application data, user data, music, photos, documents, or other data, as well as system data (whether long-term or temporary) related to the execution of the applications and functions of system 1100. In one embodiment, memory subsystem 1160 includes memory controller 1164 (which could also be considered part of the control of system 1100, and could potentially be considered part of processor 1110). Memory controller 1164 includes a scheduler to generate and issue commands to control access to memory device 1162.

Connectivity 1170 includes hardware devices (e.g., wireless or wired connectors and communication hardware, or a combination of wired and wireless hardware) and software components (e.g., drivers, protocol stacks) to enable device 1100 to communicate with external devices. The external device could be separate devices, such as other computing devices, wireless access points or base stations, as well as peripherals such as headsets, printers, or other devices. In one embodiment, system 1100 exchanges data with an external device for storage in memory or for display on a display device. The exchanged data can include data to be stored in memory, or data already stored in memory, to read, write, or edit data.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading, uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 1160 of system 1100 includes ECC engine 1192, which represents logic to perform ECC on data stored in memory 1162. In one embodiment, memory 1162 includes I/O mapping 1190, which represents a mapping of arrays of memory to specific I/O connectors in accordance with any embodiment described herein. The I/O is mapped in accordance with any embodiment described herein, where I/O is mapped to internal subarrays to enable the ECC code for the data to check internal data bit errors, as well as check the I/O data path for the subarrays due to the specific mapping. Thus, when ECC engine 1192 performs ECC computations, the ECC covers both the data and the I/O paths due to the specific mapping of the I/O data paths.

In one aspect, a memory device includes: multiple input/output (I/O) connectors to interface the memory device to an external device; a memory array, including multiple subarrays each including multiple rows of memory cells; and a data path including one or more signal lines to couple the memory array to the I/O connectors, wherein the data path is to route all data between a memory subarray and a specific I/O connector in accordance with an error checking and correcting (ECC) code matrix, where a code of the ECC code matrix corresponding to the specific I/O connector is to check and correct data corruption errors and I/O errors for the memory subarray.

In one embodiment, the memory device comprises an in-package memory device of a system-on-a-chip including a processor die. In one embodiment, the memory device comprises a dynamic random access memory (DRAM) die. In one embodiment, the multiple I/O connectors comprise an 18-bit data interface. In one embodiment, the multiple I/O connectors comprise a 36-bit data interface. In one embodiment, the memory subarray comprises a subarray of a bank of the memory device. In one embodiment, the data path is to map a single memory subarray to a specific I/O connector. In one embodiment, the data path is to map multiple memory subarrays to a specific I/O connector. In one embodiment, further comprising: a multiplexer to multiplex multiple data signal lines between the memory subarray and the specific I/O connector. In one embodiment, all data signal lines of the memory subarray route to a single multiplexer. In one embodiment, the data path is to route a burst of data bits from the memory subarray to the specific I/O connector over multiple transfer cycles. In one embodiment, the data path is to route data from the specific I/O connector to the memory subarray for a write operation. In one embodiment, the data path is to route data to the specific I/O connector from the memory subarray for a read operation.

In one aspect, a system on a chip includes: a processor die on a substrate; and an in-package dynamic random access memory (DRAM) device coupled to the processor die via the substrate, the DRAM device including multiple input/output (I/O) connectors to interface the DRAM device to the processor die; a memory bank including multiple subarrays having multiple rows of memory cells; and multiple data paths including one or more signal lines to couple the subarrays to the I/O connectors, wherein a data path is to route all data between a specific subarray and a specific I/O connector in accordance with an error checking and correcting (ECC) code matrix, where a code of the ECC code matrix corresponding to the specific I/O connector is to check and correct data corruption errors and I/O errors for the specific subarray.

In one embodiment, the multiple I/O connectors comprise an 18-bit or a 36-bit data interface. In one embodiment, the data path is to map a single subarray exclusively to the specific I/O connector. In one embodiment, the data path is to map multiple subarrays exclusively to the specific I/O connector. In one embodiment, the DRAM device further comprising: a multiplexer to multiplex multiple data signal lines between the memory subarray and the specific I/O connector. In one embodiment, all data signal lines of the memory subarray route to a single multiplexer. In one embodiment, the data paths are to route a burst of data bits from the specific subarray to the specific I/O connector over multiple transfer cycles. In one embodiment, the data path is to route data from the specific I/O connector to the memory subarray for a write operation. In one embodiment, the data path is to route data to the specific I/O connector from the memory subarray for a read operation. In one embodiment, further comprising one or more of: a memory controller on the processor die; a display communicatively coupled to the processor die; a battery to power the system; or a network interface communicatively coupled to the processor die.

In one aspect, a method for input/output (I/O) with a memory device includes: associating a memory subarray of the memory device with a specific one of multiple I/O connectors of the memory device, wherein a bit of an ECC code corresponding to the specific I/O connector is to check and correct data corruption errors and I/O errors for the associated memory subarray; and routing all I/O data signal lines between the specific I/O connector and the memory subarray.

In one embodiment, the memory device comprises an in-package memory device of a system-on-a-chip including a processor die. In one embodiment, the memory subarray comprises a subarray of a bank of a dynamic random access memory (DRAM) die. In one embodiment, the multiple I/O connectors comprise an 18-bit data interface. In one embodiment, the multiple I/O connectors comprise a 36-bit data interface. In one embodiment, the memory subarray comprises a subarray of a bank of the memory device. In one embodiment, the data path is to map a single memory subarray to a specific I/O connector. In one embodiment, the data path is to map multiple memory subarrays to a specific I/O connector. In one embodiment, routing the I/O data signal lines between the specific I/O connector and the memory subarray comprises routing the I/O data signal lines through a multiplexer to map all I/O data signal lines to the specific I/O connector. In one embodiment, routing the I/O data signal lines through the multiplexer comprises routing the I/O data signal lines of multiple memory subarrays through the multiplexer to the specific I/O connector. In one embodiment, routing the I/O data signal lines through the multiplexer comprises routing all data signal lines of the subarray to a single multiplexer. In one embodiment, routing the I/O data signal lines between the specific I/O connector and the memory subarray comprises routing the I/O data a burst of data bits from the memory subarray to the specific I/O connector over multiple transfer cycles. In one embodiment, routing the I/O data signal lines between the specific I/O connector and the memory subarray comprises routing data from the specific I/O connector to the memory subarray for a write operation. In one embodiment, routing the I/O data signal lines between the specific I/O connector and the memory subarray comprises routing data to the specific I/O connector from the memory subarray for a read operation.

In one aspect, an apparatus comprising means for performing operations to execute a method for input/output (I/O) with a memory device in accordance with any embodiment of the preceding method. In one aspect, an article of manufacture comprising a computer readable storage medium having content stored thereon which when accessed causes a machine to perform operations to execute a method for input/output (I/O) with a memory device in accordance with any embodiment of the preceding method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
   multiple input/output (I/O) connectors to interface the memory device to an external device;
   a memory array, including multiple subarrays each including multiple rows of memory cells; and
   a data path including one or more signal lines to couple the memory array to the I/O connectors, wherein the data path is to route all data between a memory subarray and a specific I/O connector in accordance with an error checking and correcting (ECC) code matrix, where a code of the ECC code matrix corresponding to the specific I/O connector is to check and correct data corruption errors and I/O errors for the memory subarray.

2. The memory device of claim 1, wherein the memory device comprises an in-package memory device of a system-on-a-chip including a processor die.

3. The memory device of claim 2, wherein the memory device comprises a dynamic random access memory (DRAM) die.

4. The memory device of claim 1, wherein the multiple I/O connectors comprise an 18-bit data interface.

5. The memory device of claim 1, wherein the multiple I/O connectors comprise a 36-bit data interface.

6. The memory device of claim 1, wherein the memory subarray comprises a subarray of a bank of the memory device.

7. The memory device of claim 1, wherein the data path is to map a single memory subarray to a specific I/O connector.

8. The memory device of claim 1, wherein the data path is to map multiple memory subarrays to a specific I/O connector.

9. The memory device of claim 1, further comprising:
   a multiplexer to multiplex multiple data signal lines between the memory subarray and the specific I/O connector.

10. The memory device of claim 9, wherein all data signal lines of the memory subarray route to a single multiplexer.

11. The memory device of claim 1, wherein the data path is to route a burst of data bits from the memory subarray to the specific I/O connector over multiple transfer cycles.

12. The memory device of claim 1, wherein the data path is to route data from the specific I/O connector to the memory subarray for a write operation.

13. The memory device of claim 1, wherein the data path is to route data to the specific I/O connector from the memory subarray for a read operation.

14. A system on a chip, comprising:
    a processor die on a substrate; and an in-package dynamic random access memory (DRAM) device coupled to the processor die via the substrate, the DRAM device including
multiple input/output (I/O) connectors to interface the DRAM device to the processor die;
a memory bank including multiple subarrays having multiple rows of memory cells; and
multiple data paths including one or more signal lines to couple the subarrays to the I/O connectors, wherein a data path is to route all data between a specific subarray and a specific I/O connector in accordance with an error checking and correcting (ECC) code matrix, where a code of the ECC code matrix corresponding to the specific I/O connector is to check and correct data corruption errors and I/O errors for the specific subarray.

15. The system of claim 14, wherein the multiple I/O connectors comprise an 18-bit or a 36-bit data interface.

16. The system of claim 14, wherein the data path is to map a single subarray exclusively to the specific I/O connector.

17. The system of claim 14, wherein the data path is to map multiple subarrays exclusively to the specific I/O connector.

18. The system of claim 14, wherein the data path is to route data from the specific I/O connector to the specific memory subarray for a write operation, and to route data to the specific I/O connector from the specific memory subarray for a read operation.

19. The system of claim 14, further comprising one or more of:
a memory controller on the processor die;
a display communicatively coupled to the processor die;
a battery to power the system; or
a network interface communicatively coupled to the processor die.

20. A method for input/output (I/O) with a memory device, comprising:
associating a memory subarray of the memory device with a specific one of multiple I/O connectors of the memory device, wherein a bit of an ECC code corresponding to the specific I/O connector is to check and correct data corruption errors and I/O errors for the associated memory subarray; and
routing all I/O data signal lines between the specific I/O connector and the memory subarray.

21. The method of claim 20, wherein the memory subarray comprises a subarray of a bank of a dynamic random access memory (DRAM) die.

22. The method of claim 20, wherein routing the I/O data signal lines between the specific I/O connector and the memory subarray comprises routing the I/O data signal lines through a multiplexer to map all I/O data signal lines to the specific I/O connector.

23. The method of claim 22, wherein routing the I/O data signal lines through the multiplexer comprises routing the I/O data signal lines of multiple memory subarrays through the multiplexer to the specific I/O connector.

* * * * *